(12) United States Patent
Martin et al.

(10) Patent No.: US 6,657,195 B1
(45) Date of Patent: Dec. 2, 2003

(54) CLUTTER DISCRIMINATING FOCAL PLANE ARRAYS

(75) Inventors: Robert J. Martin, Orlando, FL (US); Gene Raymond Loefer, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 83 days.

(21) Appl. No.: 09/665,959

(22) Filed: Sep. 21, 2000

(51) Int. Cl.$^7$ ................................................ H01L 31/09
(52) U.S. Cl. ................................ 250/339.01; 250/370.1
(58) Field of Search ....................... 250/339.01, 339.02, 250/338.4, 370.12; 257/21, 440

(56) References Cited

U.S. PATENT DOCUMENTS

| | | |
|---|---|---|
| 4,903,101 A | 2/1990 | Maserjian |
| 4,956,686 A | 9/1990 | Borrello et al. |
| 5,013,918 A | 5/1991 | Choi |
| 5,047,822 A | 9/1991 | Little, Jr. et al. |
| 5,198,659 A | 3/1993 | Smith et al. |
| 5,300,780 A | 4/1994 | Denney et al. |
| 5,355,000 A | 10/1994 | Delacourt et al. |
| 5,384,469 A | 1/1995 | Choi |
| 5,488,504 A | 1/1996 | Worchesky et al. |
| 5,539,206 A | 7/1996 | Schimert |
| 5,552,603 A * | 9/1996 | Stokes ..................... 250/338.4 |
| 5,629,522 A | 5/1997 | Martin et al. |
| 5,965,899 A | 10/1999 | Little, Jr. |
| 6,034,367 A * | 3/2000 | Waczynski et al. ...... 250/208.2 |

OTHER PUBLICATIONS

W.A. Beck, et al., "Imaging Performance of 256×256 LWIR Miniband Transport Multiple Quantum Well Focal Plane Arrays", pp. 1–14, Proc. Second Int. Symp. 2–20 μWavelength Infrared Dets. and Arrays: Phys. and Appl., Oct. 10–12, 1994, Miami Beach, Florida.

Lester J. Kozlowski, et al., "LWIR 128×128 GaAs/AlGaAs Multiple Quantum Well Hybrid Focal Plane Array", IEEE Translation on Electron Devices, vol. 38, No. 5, May 1991, pp. 1124–1130.

A Köck, et al., "Double Wavelength Selective GaAs/AlGaAs Infrared Detector Device", Applied Physics Letters 60(16), Apr. 20, 1992, pp. 2011–2013.

I. Gravé, et al., "Voltage–Controlled Tunable GaAs/AlGaAs Multistack Quantum Well Infrared Detector", Applied Physics Letters 60 (19), May 11, 1992, pp. 2362–2364.

E. Martinet, et al., Switchable Bicolor (5.5–9.0 μm) Infrared Detector Using Asymmetric GaAs/AlGaAs Multiquantum Well, Applied Physics Letters 61(3), Jul. 20, 1992, pp. 246–248.

K. Kheng, et al., "Two–Color GaAs/(AlGa)As Quantum Well Infrared Detector With Voltage–Tunable Spectral Sensitivity At 3–5 and 8–12 μm ", Applied Physics Letters 61(6), Aug. 10, 1992, pp. 666–668.

K.L. Tsai, et al., "Two–Color Infrared Photodetector Using GaAs/AlGaAs and Strained InGaAs/AiGaAs Multiquantum Wells", Applied Physics Letters 62 (26 , Jun. 28, 1993, pp. 3504–3506.

B.F.Levine, "Quantum–Well Infrared Photodetectors", Jornal of Applied Physics 74 (8), Oct. 15, 1993, pp. 1–87.

(List continued on next page.)

Primary Examiner—Scott J. Sugarman
Assistant Examiner—Richard Hanig
(74) Attorney, Agent, or Firm—Burns Doane Swecker & Mathis, LLP

(57) ABSTRACT

A quantum well infrared photodetector focal plane array is disclosed wherein each detector structure of the array comprises two vertically stacked quantum well layers. Each of the quantum well layers are individually biased by separate bias voltages and the separate bias voltages are modulated to produce two or more measurements at different spectral bands. Each detector structure of the array can therefore perform measurements of incident infrared energy in at least four separate spectral bands. This technique of measuring incident infrared energy in four separate spectral bands can advantageously be applied to the discrimination of hot gas sources from background infrared clutter.

9 Claims, 4 Drawing Sheets

OTHER PUBLICATIONS

C.G. Bethea, et al., "Long Wavelength Infrared 128×128 $Al_xGa_{1-x}As$/GaAs Quantum Well Infrared Camera and Imaging System", IEEE Transactions on Electron Devices, vol. 40, No. 11, Nov. 1993, pp. 1957–1963.

G. Sarusi, et al., "Improved Performance of Quantum Well Infrared Photodetectors Using Random Scattering Optical Coupling", Applied Physics Letters 64 (8), Feb. 21, 1994, pp. 960–962.

Y.H. Wang, et al., "A GaAs/AlAs/AlGaAs and GaAs/AlGaAs Stacked Quantum Well Infrared Photodetector For 3–5 and 8–14 $\mu$m Detection", Journal of Applied Physics 76(4), Aug. 15, 1994, pp. 2538–2540.

M.Z. Tidrow, et al., "Grating Coupled Multicolor Quantum Well Infrared Photodetectors", Applied Physics Letters 67 (13), Sep. 25, 1995, pp. 1800–1802.

C.J. Chen, et al., Corrugated Quantum Well Infrared Photodetectors For Normal Incident Light Coupling, Applied Physics Letter 68 (11), Mar. 11, 1996, pp. 1446–1448.

T.R. Schimert, et al., "Enhanced Quantum Well Infrared Photodetor With Novel Multiple Quantum Well Grating Structure", Applied Physics Letters 68 (20), May 13, 1996, pp. 2846–2848.

* cited by examiner-

CLUTTER DISCRIMINATING FOCAL PLANE ARRAYS

The present application is related to U.S. Pat. No. 6,469,358 (application Ser. No. 09/666,847), entitled "Three Color Quantum Well Focal Plane Arrays"; U.S. patent application Ser. No. 09/666,301, entitled "Two Color Quantum Well Focal Plane Arrays"; U.S. Pat. No. 6,561,693 (application Ser. No. 09/666,297), entitled "Remote Temperature Sensing Long Wavelength Modulated Focal Plane Array"; U.S. Pat. No. 6,495,830 (application Ser. No. 09/666,828), entitled "Programmable Hyper-Spectral-Infrared Focal Plane Array," and U.S. Pat. No. 6,498,346 (application Ser. No. 09/666,296), entitled "Large Dynamic Range Focal Plane Array"; all filed on an even date herewith. The disclosures of the above identified Patent Applications are herein incorporated by reference.

BACKGROUND OF THE INVENTION

1. Field of the Invention

The present invention is directed generally to Quantum Well Infrared photodetector Focal Plane Arrays (QWIP FPA's) and, more particularly, to QWIP FPA's that are capable of discriminating hot gas infrared sources from solar and thermal "clutter."

2. State of the Art

Accurate detection of infrared sources from solar and thermal infrared "clutter" is a common problem in a number of applications, including the detection of vehicle or aircraft exhaust, smoke stacks or other hot gas sources. In vehicle detection systems, a vehicle such as an airborne object (e.g., a rocket) can be identified by the hot gas exhaust emissions from the vehicle's engine. A vehicle engine such as a rocket engine can generally be modeled as sublimating carbon dioxide. Water vapor and carbon dioxide present in the earth's atmosphere produces a deep notch in the middle of the mid infrared atmospheric window. The infrared signature of a rocket engine as viewed from a distance through the earth's atmosphere thus has a characteristic blue impulse and a moderate red response. The moderated red response is due to spreading in the atmosphere and cooling effects from the hot gas exhaust of the engine.

The infrared signature of a rocket engine is generally bright and relatively easily detected. However, in certain environments, such as an urban environment, there are many false infrared sources. The primary two false infrared sources are solar and thermal "clutter." Solar clutter arises from sun glint reflected off of highly reflective surfaces and thermal clutter arises from thermal self emission from relatively warm objects. In early warning systems, solar and thermal clutter limits detection performance and increases false alarm rates. Solar reflectance causes the highest false alarm rates as the equivalent black body model for the sun acts in a manner very similar to a rocket engine. Additionally, fast moving objects such as the exhaust from large trucks, the warm engines of small aircraft, as well as emission from black tar and roof tops may also act to cause false alarms in a detection system. Solar and thermal "clutter" therefore make discrimination of a rocket engine difficult in certain environments.

One conventional approach to an early warning system that attempts to discriminate the rocket engine from "clutter" uses a single wave length system. In this conventional system, either the red or blue windows of the mid-band are selected for detection. However, with only one of these windows selected, a rocket launch, sun glint, or a warm black body may all produce a similar response. Thus, in this conventional system, the only way to detect differences between the rocket plume and clutter is to discriminate on the basis of parameters such as size, velocity, or duration.

Another conventional approach is to add an additional wavelength to produce a two color detection system. This system can thus detect the red response and the blue response band simultaneously or within the same video frame. A comparison between the system output signals can determine if the detected flux is solar or thermal "clutter" or if the detected flux originates from a rocket engine. If a comparison indicates that the blue response is greater than the red, then solar "clutter" is indicated. If the red response equals the blue response, then thermal "clutter" is indicated. If the red response is greater then the blue response, then a missile is indicated. This two color system is an improvement over the single wavelength system but relies on complicated algorithms, precise filters, and stable detectors to provide the output comparison. One example of a two color system is a conventional mechanical color wheel which uses a wide-band IR detector and an associated rotating mechanical multicolor filter wheel. The wide-band IR detector detects a broad range of incident wavelengths and the rotating filter wheel selects the desired wavelength that is to be passed to the wide-band detector. An exemplary color wheel system is disclosed in U.S. Pat. No. 5,300,780. Mechanical color wheel systems, however, suffer from a number of deficiencies in multicolor detection. Such systems generally are slow and bulky, require large amounts of power for operation, and have a limited life span. Additionally, color wheel systems tend to have poor photon collection efficiency.

Thus, it would be advantageous to construct a multicolor detection system that can discriminate hot gas sources such as, for example, rocket engines, from solar and thermal "clutter."

SUMMARY OF THE INVENTION

Discrimination of hot gas sources from solar and thermal clutter is achieved in exemplary embodiments of the invention using a multicolor detection system that can include a photodetector focal plane array. In exemplary embodiments, a detector structure of the array comprises two vertically stacked quantum well layers. Each of the quantum well layers are individually biased by separate bias voltages and the separate bias voltages are modulated to produce two or more measurements at different spectral bands over a given sampling interval. Each detector structure of the array can thus perform measurements of incident infrared energy in at least four separate spectral bands. This technique of measuring incident infrared energy in four separate spectral bands can advantageously be applied to the discrimination of hot gas sources from background infrared clutter.

One exemplary embodiment of the present invention is directed to a photosensitive device comprising: a first photosensitive layer; a second photosensitive layer, wherein said photosensitive layers are formed adjacent one another; and means for applying a plurality of bias voltages across each of said layers over a sampling interval to vary a spectral responsivity associated with each layer.

An additional exemplary embodiment of the present invention is directed to a method of detecting the presence of a remote hot gas infrared source comprising the steps of: measuring a first infrared flux at a first wavelength; measuring a second infrared flux at a second wavelength, where said first wavelength is greater than said second wavelength;

measuring a third infrared flux at a third wavelength, where said third wavelength is greater than said first wavelength; measuring a fourth infrared flux at a fourth wavelength, where said fourth wavelength is greater than said third wavelength; indicating the presence of said remote hot gas source if said second infrared flux is less than said first infrared flux and said fourth infrared flux is less than said third infrared flux.

A further exemplary embodiment of the present invention is directed to a quantum well focal plane array comprising: means for receiving incident infrared radiation, wherein said incident radiation is comprised of radiation from a hot gas source and radiation from infrared clutter; means for converting said received incident infrared radiation into moving charges; and means for processing said moving charges to discriminate said hot gas source infrared radiation from said infrared clutter radiation.

An exemplary method of biasing an infrared photodetector of the present invention comprises the steps of: a) separately biasing first and second portions of a detector structure such that said first portion is responsive to a first spectral band and said second portion is responsive to a second spectral band; and b) separately biasing said first and second portions of a detector structure such that said first portion is responsive to a third spectral band and said second portion is responsive to a fourth spectral band.

An exemplary method of discriminating an infrared target from infrared clutter comprises the steps of: receiving radiation in first and second portions of a detector structure, wherein a first quantity of said received radiation is associated with said infrared clutter and a second quantity of said received radiation is associated with said infrared target; applying a first voltage to said first portion of said detector structure to produce a first quantity of moving charges responsive to said received radiation; applying a second voltage bias to said second portion of said detector structure to produce a second quantity of moving charges responsive to said received radiation; varying said first voltage bias to produce a third quantity of moving charges responsive to said received radiation; varying said second voltage bias to produce a fourth quantity of moving charges responsive to said received radiation; and comparing voltages derived from each of said first, second, third, and fourth quantities of moving charges to discriminate said infrared target from said infrared clutter.

BRIEF DESCRIPTION OF THE DRAWINGS

Other objects and advantages of the invention will be apparent to those skilled in the art reading the following detailed description of the preferred embodiments in conjunction with the drawings in which like reference numbers have been used to indicate like elements, and wherein.

DETAILED DESCRIPTION OF THE PREFERRED EMBODIMENTS

Figure 1:
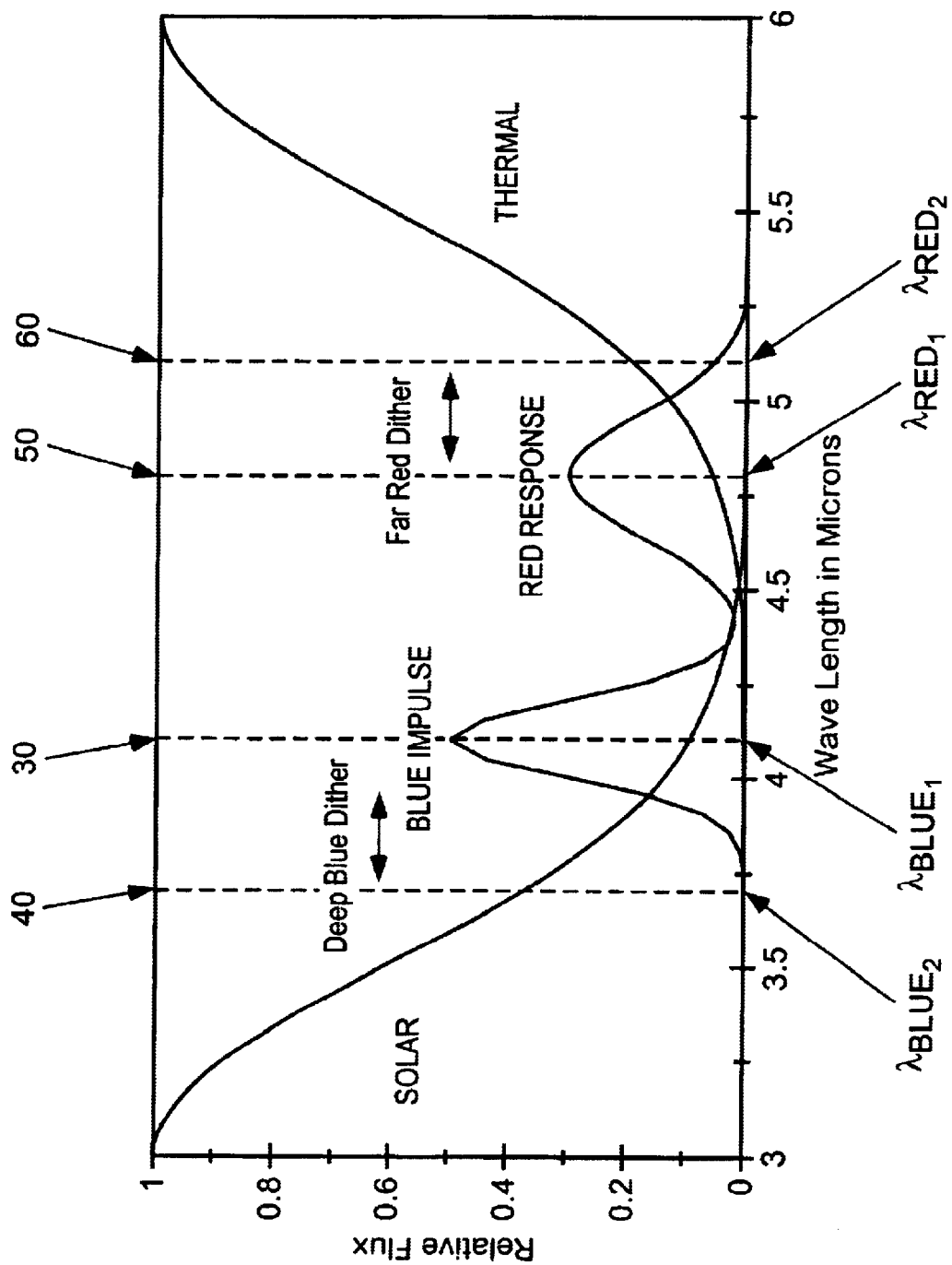
FIG. 1 is a plot of the relative flux versus wavelength of an exemplary hot gas detection scheme.

A solution of one exemplary embodiment of the invention to the problem of discriminating hot gas sources from solar and thermal "clutter" is the use of a system that can detect four different infrared colors (or spectral bands). As shown by curve 10 in FIG. 1, solar or sun glint infrared "clutter" monotonically decreases throughout the blue portion of the mid-wave infrared band. As also shown by curve 20, black body or thermal infrared "clutter" monotonically increases across the red portion of the mid-wave infrared band. Solar infrared clutter can therefore be detected by performing a first measurement at a wavelength in the blue portion of the midband, $\lambda_{Blue1}$ 30 corresponding, for example, to the peak of the blue impulse of a rocket engine hot gas signature, followed by a second wavelength $\lambda_{Blue2}$ 40, where $\lambda_{Blue1} > \lambda_{Blue2}$. If the relative flux increases from $\lambda_{Blue1}$ 30 to $\lambda_{Blue2}$ 40 then the detected infrared source is solar "clutter" or sun glint.

Additionally, thermal "clutter" can be detected by performing another measurement at a wavelength in the red portion of the midband, $\lambda_{Red1}$ 50, corresponding, for example, to the peak of the moderate red response of a rocket engine hot gas signature, followed by a measurement at a second wavelength, $\lambda_{Red2}$ 60, where $\lambda_{Red1} < \lambda_{Red2}$. If the relative flux increases from $\lambda_{Red1}$ 50 to $\lambda_{Red2}$ 60, then the detected signal is thermal clutter.

A hot gas source, such as a rocket engine exhaust, can further be discriminated from solar and thermal "clutter" based on the above measurements within the blue and red portions of the infrared mid-band. If the relative flux in the blue portion of the mid-band decreases from $\lambda_{Blue1}$ to $\lambda_{Blue2}$ and the relative flux in the red portion of the mid-band decreases from $\lambda_{Red1}$ to $\lambda_{Red2}$, then the detected signal is a hot gas source such as a rocket plume. The exemplary process described above therefore advantageously discriminates a hot gas infrared source from solar and thermal infrared "clutter."

In another exemplary embodiment of the invention, the detection method described above is implemented using QWIP FPA's. In this exemplary embodiment, a vertically stacked multi-color detector is formed as described in U.S. patent application Ser. No. 09/666,301, the disclosure of which is herein incorporated by reference. As disclosed in this Patent Application, multicolor detection can be achieved by adjusting the depths of the quantum wells comprising the different quantum well layers of the vertically stacked detector structure. Based on well known physical principles, the vertical depth of each quantum well determines the energy required from impinging photons to permit carriers in the well to escape for conduction. The vertical depth of each quantum well thus determines the spectral response of the detector to radiation in the form of impinging photons of various wavelengths.

Based on known physical principles, the allowed energy states in a quantum well are:

$$E_n = \frac{h^2 n^2}{8 \, ml^2}$$

Joules  Eqn. (1)

where h is Planck's constant=$6.626 * 10^{-34}$ Joule*seconds m is the effective mass of the carrier n is an integer n=1, 2, 3 . . .

$E_n$ is the energy of a given band in Joules l is the depth of the quantum well in meters.

For a carrier to move between the valence band (n=1) and the conduction band (n=2), the following energy $E_{1,2}$ is required to free the carrier from the valence band:

$$E_{1,2} = E_g = \frac{h^2(2^2 - 1^2)}{8\,ml^2} = \frac{3h^2}{8\,ml^2}$$

Joules  Eqn. (2)

The energy required to free the carrier from the valence band to the conduction band ($E_{1,2}$) is alternatively called the energy gap, $E_g$. The energy given up by an impinging photon must be equal to or larger than the energy gap. Photon energy is related to the wavelength of the photon by the following:

$$E_g = \frac{hc}{\lambda_p}$$

Joules  Eqn. (3)

where c is the velocity of light=$3*10^8$ meters/second (in a vacuum)

$\lambda_p$ is the peak wavelength corresponding to the middle of the band in meters.

By setting the photonic energy equal to the energy gap between the bands, the relationship of the well depth to the peak wavelength needed to free carriers is demonstrated:

$$\lambda_p = \frac{8mcl^2}{3h}$$

meters  Eqn. (4)

Eqn. (4) is based on a general model, and those skilled in the art will recognize that other factors can influence the proportionality constant between wavelength and well depth. However, the peak wavelength can generally be considered proportional to the well depth:

$$\lambda_p = a_o l^2$$

meters  Eqn. (5)

where $a_o$ is a proportionality constant

Thus, it is evident by Eqn. (5) that the spectral response of the quantum well can be "tuned" by altering the well's depth.

Figure 2:
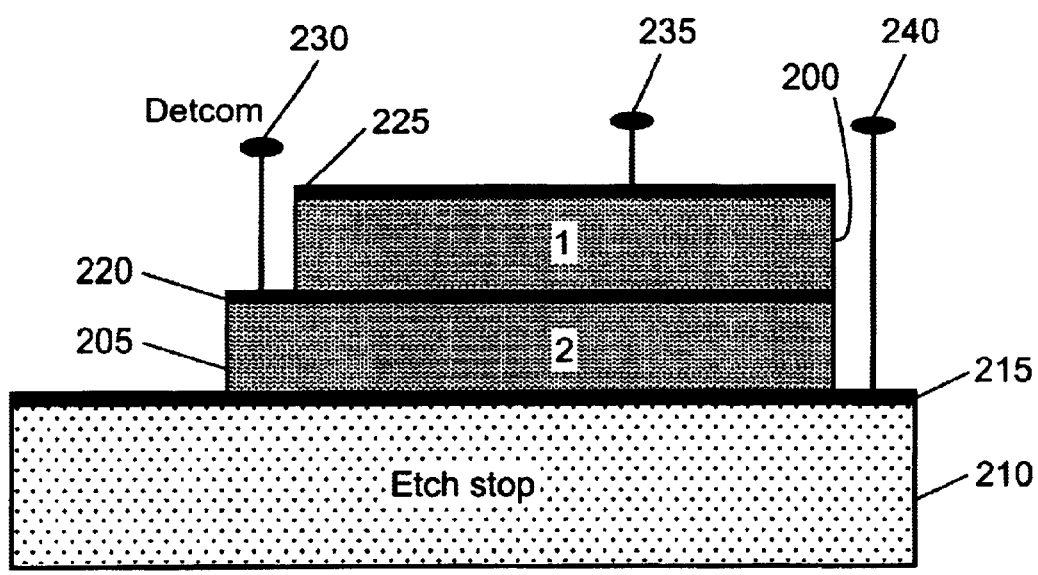
FIG. 2 is a structural diagram of a two layer quantum well detector in accordance with an exemplary embodiment of the invention.

FIG. 2 illustrates an exemplary embodiment of a dual color detector in accordance with the invention where two vertically stacked quantum wells have been "timed" to different spectral bands or "colors" by adjustment of the quantum well depths. This dual color detector is formed using a first means responsive to impinging energy, or radiation, of a first spectral band, represented in the FIG. 2 embodiment as quantum well layer 200. Quantum well layer 200, comprising one or more quantum wells having a first depth, is layered over a second means responsive to impinging energy, or radiation, of a second spectral band, represented in the FIG. 2 embodiment as second quantum well layer 205. Second quantum well layer 205 further comprises one or more quantum wells of a second depth. The first means is layered over the second means such that impinging energy in the second spectral band first passes through the first means before reaching the second means.

Using known molecular beam epitaxy (MBE) techniques, the layers of the detector can be fabricated using the following exemplary process. First, an etch stop layer 210 is formed and then a first contact layer 215, doped to a first conductivity, is formed upon a surface of the etch stop layer 210. Next, a first quantum well layer 205 comprising one or more quantum wells of a depth corresponding to a first desired peak wavelength is formed on a surface of the first doped contact layer 215. A second contact layer 220, doped to a second conductivity, is next formed upon a surface of the first quantum well layer 205. A second quantum well layer 200 comprising one or more quantum wells of a depth corresponding to a second desired peak wavelength is then formed on a surface of the second doped contact layer 220, followed by a third contact layer 225 doped to a third conductivity. The first contact layer 215, and contact layers 220 and 225 may be composed of doped GaAs, though one skilled in the art will recognize that other suitable contact layer materials can be used. As referenced herein, the formation of each layer can be performed using any conventional techniques appropriate for the layer being established including, but not limited to, growth or deposition techniques.

Additionally, an electrical contact 230 is connected to the second contact layer 220 for connection to the common bias voltage DETCOM of the Read Out Integrated Circuit (ROIC). Electrical contacts 235 and 240 are further connected to contact layers 225 and 220, respectively, for connection to individual detector bias voltages supplied by the ROIC. The difference between the common bias voltage and the individual bias voltages supplied by the ROIC to each of the electrical contacts 235 and 240 establishes different bias voltages across each of the quantum well layers 200 and 205 of the detector. Electrical contacts 235 and 240, each being associated with a different one of the quantum well layers 200 and 205, thus provide means for biasing each band independently of one another in conjunction with the individual detector bias voltages supplied by the ROIC. During operation, electrical contacts 235 and 240 constitute outputs of the detector which supply photocurrent from each quantum well layer to the ROIC circuitry associated with each vertically stacked detector. Electrical contacts 230, 235, and 240 can be, for example, formed as Indium "bumps," or as any conventional contact known to those skilled in the art.

The quantum well layers 200 and 205 of FIG. 2 can additionally be comprised of one or more asymmetric quantum well's. Asymmetric quantum wells are known in the art as is indicated by U.S. Pat. No. 5,355,000 and the journal article by Martinet et al., "Switchable Bicolor (5.5–9.0 µm) Infrared Detector Using Asymmetric GaAs/AlGaAs Multi-quantum well," Appl. Phys. Lett. 61 (3), Jul. 20, 1992, the disclosures of which are herein incorporated by reference. Using asymmetric quantum wells, the spectral response of quantum well layers 200 and 205 in FIG. 2 can additionally be tuned from the nominal wavelength $\lambda_p$ of Eqn. (5) through the known phenomenon called "band splitting." "Band splitting" can be induced in an asymmetric multiple quantum well through the application of an electric field across the quantum well. In the lowest energy state in an asymmetric step quantum well, for example, this "band splitting" is represented by the following equation:

$$E_2 - E_{1+v} = \frac{h^2((2-v)^2 - (1+v)^2)}{8 \text{ mL}^2}$$

joules    Eqn. (6)

where v is proportional to the applied bias voltage and represents the "split in the band."

Therefore, the peak wavelength needed to free carriers with an applied bias voltage is the following:

$$\lambda_p = \frac{8 \text{ L}^2 \text{ cm}}{((2-\%)^2 - (1+\%)^2)h}$$

meters    Eqn. (7)

or, in simplified form:

$$\lambda_p = \frac{8 \text{ L}^2 \text{ cm}}{9(1 - 2\%)^2 h}$$

meters    Eqn. (8)

where $\in$ the normalized electric field.

Thus, the peak wavelength $\lambda_p$ can be represented generally by the following equation:

$$\lambda_p = \frac{BL^2}{(1 - v/3)^2}$$

meters    Eqn. (9)

where v is the applied bias in volts and B is a constant. Eqn. (9) above therefore demonstrates that the peak wave length of a quantum well can be "tuned" from a nominal wavelength $\lambda_p$, that is initially set by the depth of each quantum well in the layer, by varying the bias voltage across the asymmetric step quantum well. This is called the quadratic Stark effect.

Figure 3:
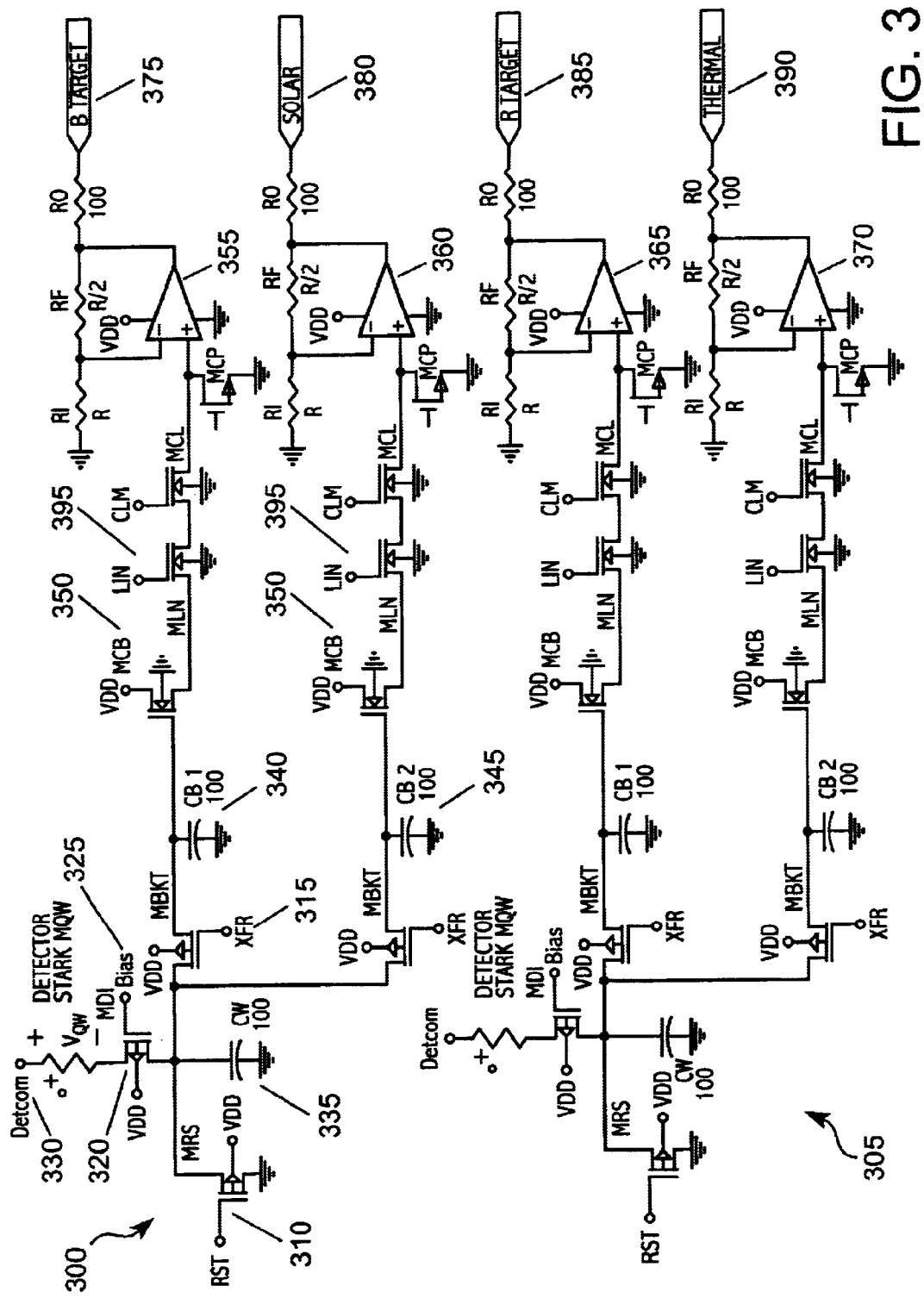
FIG. 3 is a schematic of a readout circuit in accordance with an exemplary embodiment of the invention.

Using the quadratic Stark effect, each quantum well layer 200 and 205 can be "tuned" to discriminate, for example, hot gas sources from solar and thermal "clutter" as described in the exemplary process above. To perform this "clutter" discrimination, a Read Out Integrated Circuit (ROIC) of another exemplary embodiment can be used. As schematically illustrated in FIG. 3, the ROIC for each detector in the FPA comprises two circuits 300 and 305—one associated with each quantum well layer 200 and 205 of the detector. Each circuit 300 and 305 comprises a direct injection transistor, a single charge well, a reset switch, two charge buckets, two charge well to bucket transfer switches, two time division multiplexers, and two output amplifiers. Circuits 300 and 305 both generally operate in a similar manner. Therefore, for purposes of illustration, the following description will focus solely on circuit 300. The description of the operation of circuit 300, however, also applies to the contemporaneous operation of circuit 305 and its associated quantum well layer.

Circuit 300, through application of the reset control voltage RST 310 and the charge transfer voltage XFR 315, performs a dump, ramp, and sample (DRS) process that integrates the output, of the photo-current from a quantum well layer of the detector. To provide a photo-current from the quantum well layer, the direct injection transistor 320 maintains a relatively constant voltage across the quantum well layer for the duration of each integration period. To "tune" each quantum well layer by the Stark effect, each quantum well layer bias can be modulated by either changing the injection transistor bias voltage 325 or the detector common voltage Detcom 330.

A switched capacitor filter with a single charge well CW 335 and two charge buckets $C_{B1}$ 340 and $C_{B2}$ 345 can be used for processing the current supplied by each quantum well layer as the bias across the layer is modulated to vary its spectral response. Thus, when the bias across a given quantum well layer is modulated to tune the quantum well layer to a first wavelength $\lambda_1$, the charge from the quantum well layer accumulated in the charge well is supplied to charge bucket $C_{B1}$ 340. Furthermore, when the bias across the quantum well layer is again modulated so as to tune the quantum well layer to a second wavelength $\lambda_2$, the charge from the quantum well layer that is accumulated in the charge well is supplied to charge bucket $C_{B2}$ 345. This process therefore provides both colors contemporaneously in one video frame. Additionally, the correlation coefficient between the two compared colors is precise as the same detector is used for both wavelengths.

The read out circuitry 300 shown uses two separate circuit paths for processing the photo-current derived from a quantum well layer of FIG. 1. One circuit path processes the photo-current when the quantum well is "tuned" to a first spectral band over a first time period and the other circuit path processes the photo-current when the quantum well is "tuned" to a second spectral band over a second time period. The processing of the photo-current from the quantum well layer uses a "cup" and "bucket" technique where the charge well capacitor $C_W$ 335 represents the charge "cup" and the charge hold capacitors $C_{B1}$ 340 and $C_{B2}$ 345 represent the charge "buckets." The single "cup" and the two "buckets" operate in successive DRS processes to integrate the photo-current from a quantum well layer and to provide voltages derived from the integrated photo-current to either input of the amplifiers 355 or 360.

Figure 4:
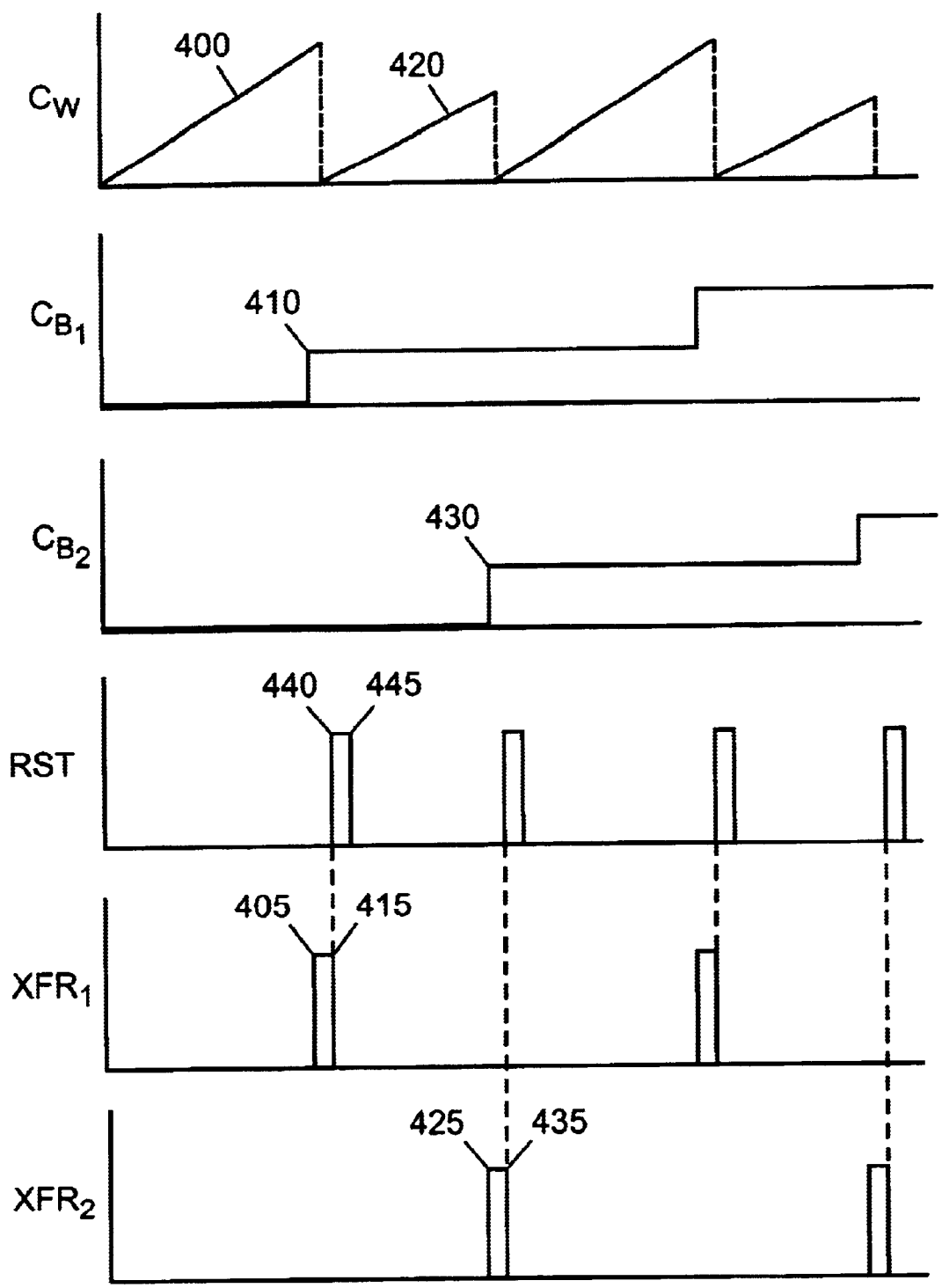
FIG. 4 is a timing diagram of a charge transfer process of an exemplary embodiment of the invention.

One cycle of the exemplary read out circuitry 300 and 305 operates in the following described manner. During a first dump-ramp-sample (DRS) process, the reset switch $RST_1$ 310 is opened and the photo-current from the detector begins to cause charge to be accumulated (400, FIG. 4) in the charge well $C_W$ 335. When a sufficient quantity of charges is stored in charge well $C_W$ 335, switch $XFR_1$ 315 is closed (405, FIG. 4) to transfer the charges (410, FIG. 4) from the "cup" capacitor ($C_W$ 335) to the "bucket" capacitor ($C_{B1}$, 340). When the stored charge in the "cup" is sufficiently emptied into the "bucket," switch $XFR_1$ 315 is opened (415, FIG. 4). A voltage derived from the charges stored in $C_{B1}$ 340 is supplied, via the time division multiplexer 395, to amplifier 355.

After switch $XFR_1$ is opened, the RST switch 310 is closed (440, FIG. 4) for a first time period to "dump" any charge stored in charge well 335. The RST switch 310 is then opened (445, FIG. 4) and the photo-current from the detector begins to cause charge to be accumulated (420, FIG. 4) in the charge well $C_W$ 335. When a sufficient quantity of charges is stored in charge well $C_W$ 335, switch $XFR_2$ 317 is closed (425, FIG. 4) to transfer the charges (430, FIG. 4) from the "cup" capacitor ($C_W$ 335) to the "bucket" capacitor ($C_{B2}$, 345). When the stored charge in the "cup" is sufficiently emptied into the "bucket," switch $XFR_2$ 317 is opened (435, FIG. 4). A voltage derived from the charges stored in $C_{B2}$ 345 is supplied, via the time division multiplexer 397, to amplifier 360.

The charge accumulated in each charge bucket $C_{B1}$ and $C_{B2}$ is provided via the time division multiplexers 395 and 397 to amplifiers 355 and 360, which in turn provide the output voltages 375 and 380. During a first portion of the sampling cycle, an output designated "B Target" 375 is provided from amplifier 355 when the quantum well layer 200 is tuned to peak wavelength $\lambda_{Blue1}$. During the same first portion of the sampling cycle, an output designated "R Target" 385 is provided from amplifier 365 when quantum well layer 205 is tuned to peak wavelength $\lambda_{Red1}$. During a second portion of the sampling cycle, an output designated "Solar" 380 is provided from amplifier 360 when quantum well layer 200 is tuned to peak wavelength $\lambda_{Blue2}$. Additionally, during this same second portion of the sampling cycle, an output voltage designated "thermal" 390 is provided from amplifier 370 when quantum well layer 205 is tuned to peak wavelength $\lambda_{Red2}$. Output voltages "B Target" 375 at $\lambda_{Blue1}$, "Solar" 380 at $\lambda_{Blue2}$, "R Target" at $\lambda_{Red1}$, and "Thermal" at $\lambda_{Red2}$ can be compared using the exemplary process described above to discriminate a hot gas source from solar and thermal infrared "clutter." One skilled in the art will recognize that the DRS capacitor filter arrangement of FIG. 3 can be replaced with a cup and bucket switched capacitor filter arrangement as described in U.S. Pat. No. 5,629,522, entitled "Apparatus for and Method of Providing Long Integration Times in an IR Detector," the disclosure of which is incorporated herein by reference.

The result of the above described detection process is a four color output without the cost, size, weight, limited life, and loss of photon collection efficiency of a conventional color wheel. By making use of the Stark effect, through variance of the bias voltages applied to vertically stacked two layer quantum well detectors arranged in an array, exemplary embodiments of the invention enable the focal plane to discriminate hot gas sources such as rocket engines, aircraft exhaust, or smoke stacks from solar or thermal infrared clutter.

One skilled in the art will recognize that the three or more quantum well layer detector structure described in U.S. Pat. No. 6,469,358 (application Ser. No. 09/666,847) can be employed alternatively instead of the two layer detector shown in FIG. 2. Use of such a detector structure would correspondingly require additional readout circuits (such as circuit 300 of FIG. 3) for each quantum well layer. Use of three or more quantum well layers would permit the detection of at least two additional peak wavelengths within a given frame.

In an additional exemplary embodiment of the invention, higher density focal plane arrays can be produced by removing the charge wells from the ROIC and fabricating the charge wells within the detector structure itself. The smaller pitch required of higher density arrays limits the usable area available for the charge wells in the ROIC underlying the detector structure. By fabricating the charge wells integrally to the detector itself, less space is required in the underlying ROIC and therefore higher densities can be achieved in the array. The technique of using integral charge wells is disclosed in U.S. patent application Ser. No. 09/149,483, entitled "Integral Charge Well for QWIP FPA's," the disclosure of which is herein incorporated by reference.

Optical coupling, in accordance with exemplary embodiments of the invention, can be achieved using a number of different techniques. Principles of quantum selection require that incident electromagnetic fields propagate in the horizontal plane of the quantum well. The incident flux must therefore be reflected inside the quantum well at an angle such that the flux passes through the material many times. In one exemplary embodiment, a rotated waffle diffraction grating is used, where the width of the waffle corresponds to one wavelength, the length of the waffle to another, and the diagonal to a third wavelength. The waffle grating, combined with a top side grating and side wall reflecting mirrors, constitute the optimum "photon in a box" quantum well detector optical system. Additionally, the waffle grating can be enhanced with a flux entry side anti-reflective coating composed of, for example, a quarter wavelength dielectric material. In addition to the waffle grating, one skilled in the art will recognize that a number of different techniques can be used for achieving optical coupling in the present invention. Such techniques include use of random gratings, reflectors, resonance structures, and so forth.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A photosensitive device comprising:

a first photosensitive layer;

a second photosensitive layer, wherein said photosensitive layers are formed adjacent one another; and means for applying a plurality of bias voltages across each of said layers over a sampling interval to vary a spectral responsivity associated with each layer.

2. The photosensitive device of claim 1, wherein each photosensitive layer comprises a quantum well layer.

3. The photosensitive device of claim 1. wherein a first bias is applied across said first photosensitive layer to produce a first spectral response of said first layer and a second bias is applied across said second photosensitive layer to produce a second spectral response of said second layer.

4. The photosensitive device of claim 3, wherein a third bias is applied across said first photosensitive layer to produce a third spectral response of said first layer and a fourth bias is applied across said second photosensitive layer to produce a fourth spectral response of said second layer.

5. The photosensitive device of claim 1, wherein said first photosensitive layer comprises one or more quantum wells and wherein each of said one or more quantum wells comprises a first depth selected on the basis of a desired peak wavelength.

6. The photosensitive device of claim 1, wherein said second photosensitive layer comprises one or more quantum wells and further wherein each of said one or more quantum wells comprises a depth selected on the basis of a desired peak wavelength.

7. The photosensitive device of either of claims 5 or 6, wherein said desired peak wavelength is varied based on the bias applied across said layer.

8. A method of biasing an infrared photodetector comprising the steps of:

a) separately biasing first and second portions of a detector structure such that said first portion is responsive to a first spectral band and said second portion is responsive to a second spectral band; and b) separately biasing said first and second portions of a detector structure such that said first portion is responsive to a third spectral band and said second portion is responsive to a fourth spectral band.

9. A method of discriminating an infrared target from infrared clutter comprising the steps of:

receiving radiation in first and second portions of a detector structure, wherein a first quantity of said received radiation is associated with said infrared clutter and a second quantity of said received radiation is associated with said infrared target;

applying a first voltage to said first portion of said detector structure to produce a first quantity of moving charges responsive to said received radiation;

applying a second voltage bias to said second portion of said detector structure to produce a second quantity of moving charges responsive to said received radiation;

varying said first voltage bias to produce a third quantity of moving charges responsive to said received radiation;

varying said second voltage bias to produce a fourth quantity of moving charges responsive to said received radiation; and comparing voltages derived from each of said first, second, third, and fourth quantities of moving charges to discriminate said infrared target from said infrared clutter.

* * * * *

UNITED STATES PATENT AND TRADEMARK OFFICE
CERTIFICATE OF CORRECTION

PATENT NO.    : 6,657,195 B1                                                      Page 1 of 1
DATED         : December 2, 2003
INVENTOR(S)   : Robert J. Martin et al.

It is certified that error appears in the above-identified patent and that said Letters Patent is hereby corrected as shown below:

Column 10,
Line 38, "claim 3. wherein" is corrected to read -- claim 3, wherein --.

Signed and Sealed this

Sixteenth Day of March, 2004

JON W. DUDAS
*Acting Director of the United States Patent and Trademark Office*